United States Patent
Chiesi et al.

(10) Patent No.: US 8,736,381 B2
(45) Date of Patent: May 27, 2014

(54) DETECTION DEVICE PROVIDED WITH A TRANSIMPEDANCE CIRCUIT

(71) Applicant: Schneider Electric Industries SAS, Rueil Malmaison (FR)

(72) Inventors: Laurent Chiesi, Reaumont (FR); Hynek Raisigel, Sassenage (FR)

(73) Assignee: Schneider Electric Industries SAS, Rueil Malmaison (FR)

(*) Notice: Subject to any disclaimer, the term of this patent is extended or adjusted under 35 U.S.C. 154(b) by 25 days.

(21) Appl. No.: 13/650,902

(22) Filed: Oct. 12, 2012

(65) Prior Publication Data

US 2014/0103994 A1    Apr. 17, 2014

(51) Int. Cl.
*H03F 3/08* (2006.01)

(52) U.S. Cl.
USPC ......... 330/308; 330/124 R; 330/254; 330/295

(58) Field of Classification Search
USPC ............................ 330/308, 124 R, 254, 295
See application file for complete search history.

(56) References Cited

U.S. PATENT DOCUMENTS

| | | | | |
|---|---|---|---|---|
| 4,900,917 A | * | 2/1990 | Dixon et al. | 250/225 |
| 5,852,286 A | * | 12/1998 | Coleman | 235/462.01 |
| 5,880,827 A | * | 3/1999 | Heinke | 356/224 |
| 6,292,052 B1 | * | 9/2001 | Carlson | 330/9 |
| 6,756,578 B1 | * | 6/2004 | Kaiser | 250/214.1 |
| 6,834,165 B2 | * | 12/2004 | Feng | 398/202 |
| 7,205,845 B2 | * | 4/2007 | Harms et al. | 330/308 |
| 2011/0316632 A1 | | 12/2011 | Takemoto et al. | |

FOREIGN PATENT DOCUMENTS

| | | |
|---|---|---|
| WO | WO 2006/031793 A1 | 3/2006 |
| WO | WO 2006/049985 A2 | 5/2006 |
| WO | WO 2010/100741 A1 | 9/2010 |

OTHER PUBLICATIONS

Shigetaka Takagi et al., "Multi-Path Analog Circuits Robust to Digital Substrate Noise", IEICE Trans. Fundamentals of Communications and Computer Sciences, Engineering Science Society, vol. E91-A, No. 2, Feb. 2008, XP 001511216, pp. 535-541.

* cited by examiner

*Primary Examiner* — Patricia Nguyen
(74) *Attorney, Agent, or Firm* — Oblon, Spivak, McClelland, Maier & Neustadt, L.L.P.

(57) ABSTRACT

The invention concerns a detection device including a photodiode (Ph) designed to capture a luminous signal to transform it into a current (Iph) and including first and second terminals, a transimpedance amplifier circuit connected between the first terminal and the second terminal of the photodiode (Ph) and designed to amplify the current (Iph) coming from the photodiode (Ph). The transimpedance amplifier circuit includes a plurality of operational amplifiers (AOP1, AOP2, AOP3) connected in parallel and a gain resistor ($R_{gain}$) common to all the connected amplifiers.

5 Claims, 1 Drawing Sheet

SNR improvement

DETECTION DEVICE PROVIDED WITH A TRANSIMPEDANCE CIRCUIT

TECHNICAL FIELD OF THE INVENTION

The present invention relates to a detection device provided with a transimpedance amplifier circuit.

PRIOR ART

Detection devices exist that are designed to detect different types of gas. These devices are based on an optical emitter composed of a light-emitting diode enabling emission of a luminous signal associated with a receiver composed of a photodiode designed to capture the luminous signal to transform it into an electric current usable by processing means. Optical emitters exist for different wavelengths, enabling detection of different types of gas as a function of the absorption wavelength of the gas. Moreover, these devices include at their output a transimpedance amplifier circuit enabling amplification of the output current of the photodiode in order to obtain an output voltage. This transimpedance amplifier circuit generally includes a single operational amplifier provided with a negative input, a positive input and an output. The photodiode is connected between the positive input and the negative input of the operational amplifier and a gain resistor is connected between the negative input and the output of the operational amplifier.

Photodiodes that function in the absorption zone of carbon dioxide ($CO_2$) unfortunately have a parallel resistance (shunt resistance) that is very low (a few tens of ohms). As the shunt resistance of the photodiode is very low compared to the resistance of the gain resistor, noise is strongly amplified at the output of the transimpedance circuit. This is simply explained by the following equation:

$$e_{out} \approx \frac{R_{gain}}{R_{shunt}} \cdot \sqrt{e_{aop}^2 + 4 \cdot k \cdot T \cdot R_{shunt}}$$

In the above equation:
$e_{out}$ is the noise at the output of the transimpedance circuit,
$R_{gain}$ is the gain resistance,
$R_{shunt}$ is the shunt resistance of the photodiode,
$e_{aop}$ is the input voltage noise generated by an operational amplifier,
k is Boltzmann's constant,
T is temperature.

In present-day circuits, to reduce the noise at the output of the transimpedance amplifier circuit, an operational amplifier is used having the lowest possible input voltage noise. For some applications, however, such as a low power consumption device for detecting carbon dioxide, the characteristics of existing operational amplifiers are not satisfactory.

Signal amplifier systems are known from the documents WO2006/031793 and WO2006/049985.

The object of the invention is to propose a detection device provided with a transimpedance amplifier circuit in which the noise at the output of the transimpedance amplifier circuit is low.

SUMMARY OF THE INVENTION

The above object is achieved by a detection device including a photodiode designed to capture a luminous signal to transform it into a current and having a first terminal and a second terminal, a transimpedance amplifier circuit connected between the first terminal and the second terminal of the photodiode and designed to amplify the current coming from the photodiode, the transimpedance amplifier circuit including:
a first operational amplifier having a positive input, a negative input and an output,
a second operational amplifier having a positive input connected to the positive input of the first operational amplifier, a negative input connected to the negative input of the first operational amplifier and an output connected to the output of the first operational amplifier,
a common gain resistor connected in parallel with the two operational amplifiers.

According to one particular feature the device includes a first resistor connected in series with the output of the first operational amplifier and a second resistor connected in series with the output of the second operational amplifier.

According to another particular feature the first resistor and the second resistor have a value lower than that of the gain resistor.

According to another particular feature the first resistor and the second resistor have exactly the same value.

According to another particular feature the value of the resistors is chosen to be greater than the highest of the output impedances of the operational amplifiers.

BRIEF DESCRIPTION OF THE FIGURES

Other features and advantages will become apparent in the following detailed description with reference to the appended drawings, in which.

DETAILED DESCRIPTION OF AT LEAST ONE EMBODIMENT

The invention concerns a detection device, notably for detecting the presence of gas, such as carbon dioxide. The detection device of the invention has the particular feature of consuming very little energy.

Figure 1:
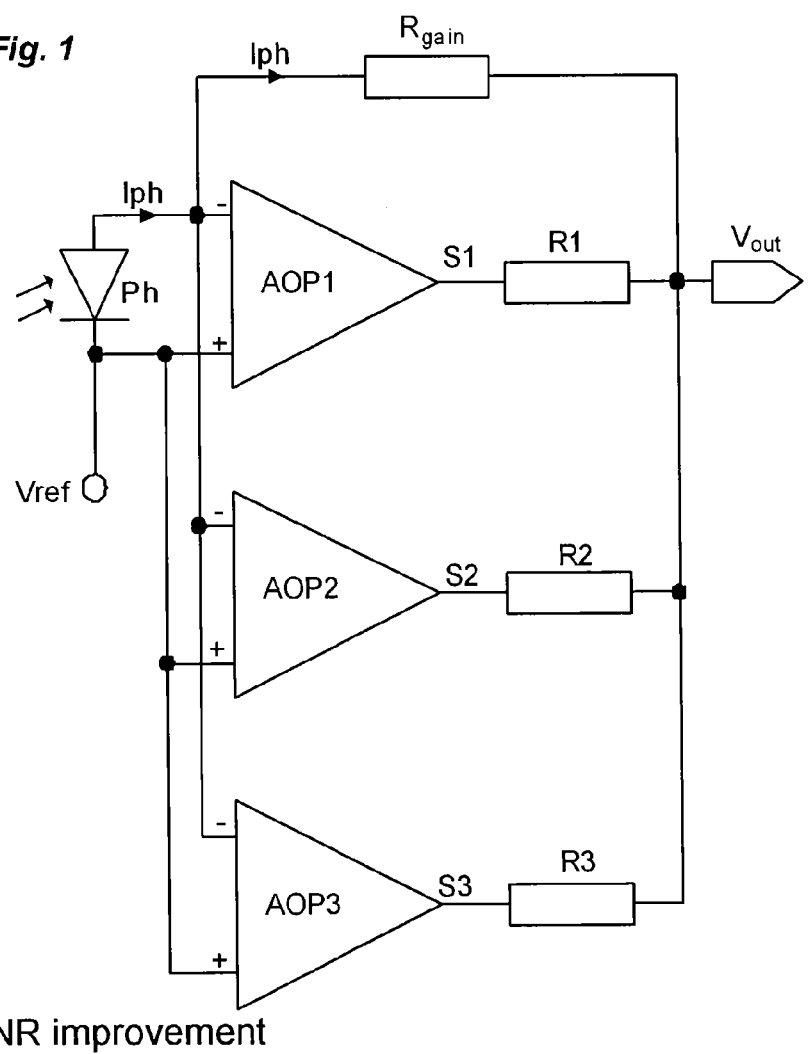
FIG. 1 is a block diagram of the transimpedance amplifier circuit connected to a photodiode in a detection device.

This detection device includes a receiver composed of a photodiode Ph designed to capture a luminous signal and to transform it into an electric current Iph. In FIG. 1, the photodiode is oriented in one direction but it must be understood that it may be oriented in the opposite direction.

According to the invention, the device also includes a transimpedance amplifier circuit connected to the terminals of the photodiode Ph and enabling amplification of the current emitted by the photodiode Ph.

The transimpedance amplifier circuit of the invention has the particular feature of including at least two operational amplifiers in parallel. In FIG. 1, three operational amplifiers AOP1, AOP2, AOP3 are connected to the photodiode Ph but it is conceivable to connect a greater number of them. Of course, the invention must be understood as if the transimpedance amplifier circuit could include N operational amplifiers connected in parallel, with N≥2.

Referring to FIG. 1, each operational amplifier AOP1, AOP2, AOP3 has a positive input (designated + in FIG. 1), a negative input (designated − in FIG. 1) and an output S1, S2, S3. The negative inputs of the operational amplifiers are connected to each other and to one of the two terminals of the photodiode Ph to receive the current Iph generated by the photodiode and the positive inputs of the operational amplifiers are connected to each other, to the other of the two terminals of the photodiode Ph and to a voltage source supplying a reference voltage Vref. If the operational amplifiers employed are different, the transimpedance amplifier circuit preferably includes a plurality of resistors R1, R2, R3 each connected in series with the output S1, S2, S3 of a separate operational amplifier. These resistors R1, R2, R3 enable balancing of the output currents of the amplifiers. These resistors R1, R2, R3 all have exactly the same value, for example, and this value is advantageously chosen to be higher than the highest of the output impedances of the operational amplifiers.

Finally, the transimpedance circuit also includes a gain resistor $R_{gain}$ in parallel with the amplifiers and their series-connected resistor. This gain resistor $R_{gain}$ is connected to the negative inputs of the operational amplifiers. If the resistors R1, R2, R3 are employed, the gain resistor $R_{gain}$ has a value higher than the value of these resistors R1, R2, R3.

This parallel arrangement of N operational amplifiers enables reduction by a factor of $$\sqrt{N}$$

of the contribution of the input voltage noise of the operational amplifier to the expression for the noise at the output of the transimpedance amplifier circuit.

With the circuit of the invention, the noise at the output of the transimpedance amplifier circuit is expressed in the following manner:

$$e_{out} \approx \frac{R_{gain}}{R_{shunt}} \cdot \sqrt{\left(\frac{e_{aop}}{\sqrt{N}}\right)^2 + 4 \cdot k \cdot T \cdot R_{shunt}}$$

Moreover, the use of a single compensation branch that includes the gain resistor $R_{gain}$ for all the operational amplifiers rather than one compensation branch for each operational amplifier makes it possible to prevent the current Iph emitted by the photodiode Ph from being divided between the different branches and thus decreasing commensurately the amplified signal.

The signal $V_{out}$ obtained at the output of the transimpedance amplifier circuit is thus expressed in the following manner:

$$V_{out} = R_{gain} \cdot I_{ph}.$$

The signal to noise ratio (SNR) at the output of the transimpedance amplifier circuit is then as follows:

$$SNR = \frac{R_{shunt} \cdot I_{ph.}}{\sqrt{\left(\frac{e_{aop}}{\sqrt{N}}\right)^2 + 4 \cdot k \cdot T \cdot R_{shunt}}}$$

Figure 2:
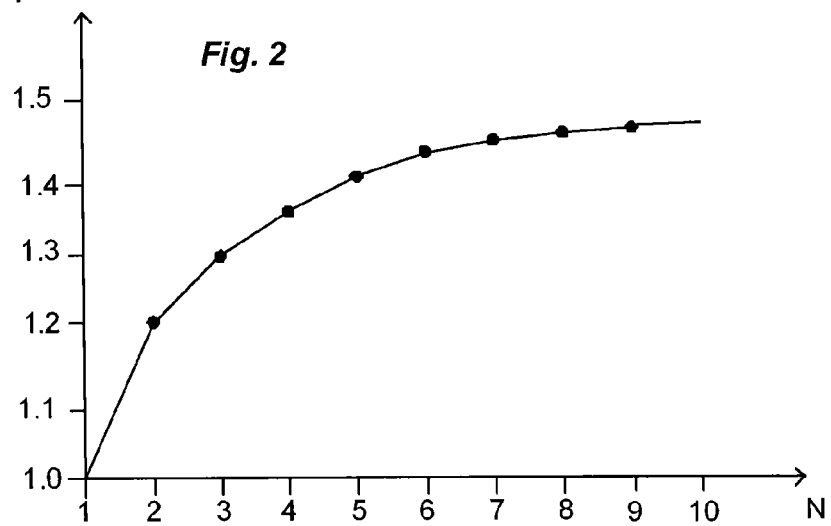
FIG. 2 is a curve showing the effect of a number of operational amplifiers in series on the signal to noise ratio, with the number of operational amplifiers employed plotted on the abscissa axis and the signal to noise ratio improvement plotted on the ordinate axis.

This expression shows that it is beneficial to multiply the number of operational amplifiers in parallel to increase the signal to noise ratio. The curve shown in FIG. 2 illustrates this phenomenon. This curve shows that the improvement is really beneficial with three or four operational amplifiers. Beyond that number, the signal to noise ratio is no longer increased significantly and cannot justify a corresponding increase in the cost of the solution, its overall size and its electrical consumption. The asymptotic nature of this curve reflects the fact that the thermal noise of the shunt resistor becomes predominant from a certain value of N.

The invention claimed is:

1. Detection device including a photodiode designed to capture a luminous signal to transform it into a current and having a first terminal and a second terminal, a transimpedance amplifier circuit connected between the first terminal and the second terminal of the photodiode and designed to amplify the current coming from the photodiode, wherein the transimpedance amplifier circuit includes:
    a first operational amplifier having a positive input, a negative input and an output,
    a second operational amplifier having a positive input connected to the positive input of the first operational amplifier, a negative input connected to the negative input of the first operational amplifier and an output connected to the output of the first operational amplifier,
    a common gain resistor connected in parallel with the two operational amplifiers.

2. Detection device according to claim 1, wherein a first resistor is connected in series with the output of the first operational amplifier and a second resistor is connected in series with the output of the second operational amplifier.

3. Detection device according to claim 2, wherein the first resistor and the second resistor have a value lower than that of the gain resistor.

4. Detection device according to claim 2 or claim 3, wherein the first resistor and the second resistor have exactly the same value.

5. Detection device according to claim 4, wherein the value of the resistors is chosen to be greater than the highest of the output impedances of the operational amplifiers.

* * * * *